United States Patent
Bedell et al.

(10) Patent No.: US 6,989,058 B2
(45) Date of Patent: Jan. 24, 2006

(54) USE OF THIN SOI TO INHIBIT RELAXATION OF SIGE LAYERS

(75) Inventors: Stephen W. Bedell, Wappingers Falls, NY (US); Huajie Chen, Wappingers Falls, NY (US); Keith E. Fogel, Mohegan Lake, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 10/654,232

(22) Filed: Sep. 3, 2003

(65) Prior Publication Data

US 2005/0048778 A1 Mar. 3, 2005

(51) Int. Cl.
*C30B 25/02* (2006.01)

(52) U.S. Cl. .............................. 117/4; 117/89; 438/689
(58) Field of Classification Search .................... 117/4, 117/89; 438/689
See application file for complete search history.

(56) References Cited

U.S. PATENT DOCUMENTS

| 6,841,457 B2 * | 1/2005 | Bendell et al. ............. 438/479 |
| 6,861,158 B2 * | 3/2005 | Bedell et al. ............... 428/641 |

* cited by examiner

*Primary Examiner*—Felisa Hiteshew
(74) *Attorney, Agent, or Firm*—Scully, Scott, Murphy & Presser; Robert M. Trepp, Esq.

(57) ABSTRACT

High-quality, metastable SiGe alloys are formed on SOI substrates having an SOI layer of about 500 Å or less, the SiGe layers can remain substantially fully strained compared to identical SiGe layers formed on thicker SOI substrates and subsequently annealed and/or oxidized at high temperatures. The present invention thus provides a method of 'frustrating' metastable strained SiGe layers by growing them on thin, clean and high-quality SOI substrates.

30 Claims, 5 Drawing Sheets

USE OF THIN SOI TO INHIBIT RELAXATION OF SIGE LAYERS

FIELD OF THE INVENTION

The present invention relates to a method of fabricating SiGe-on-insulator substrate materials, and more particular to a method of fabricating SiGe-on-insulator substrate materials in which the SiGe alloy layer is metastable, yet very resistant to relaxation. The present invention also relates to the SiGe-on-insulator substrate materials produced using the method of the present invention.

BACKGROUND OF THE INVENTION

In the semiconductor industry, there has recently been a high-level of activity using strained Si-based heterostructures to achieve high mobility structures for complementary metal oxide semiconductor (CMOS) applications. In such heterostructures, the strained Si is typically formed atop a relaxed SiGe alloy layer.

Relaxation of SiGe alloy layers can occur when the thickness of the layer exceeds a certain value (called the critical thickness) for a given Ge concentration in the alloy. The relaxation of strained SiGe alloy layers that are thicker than the critical thickness occurs primarily through the formation of strain-relieving misfit dislocations. Strained SiGe layers that are grown thicker than the critical thickness, but remain strained and defect-free, are said to be metastable. In fact, any strained layer whose total film energy (including the strain, thickness and defect components) is not minimized with respect to defect production is, by definition, metastable.

Metastable-strained SiGe layers can be defect free if the growth conditions are chosen correctly. Specifically, relaxation by defect formation almost always occurs at local microscopic defect sites at the strained Si/SiGe interface. The growth of metastable SiGe layers, then, is most successful when the growth surface is atomically clean and free of existing defects. Once a metastable SiGe layer is grown, it can relax if the layers are annealed at a high enough temperature. The nucleation and growth rate of misfit dislocations are strongly temperature dependent. Relaxation occurs by defect production and growth until 1) there is not enough strain energy within the film to create another dislocation, and 2) the existing dislocations stall, become pinned, or get trapped by some other mechanism.

The above physical properties of metastable strained SiGe layers put limitations on what initial SiGe layers can be applied to the thermal mixing method of fabricating SiGe-on-insulator (SGOI) substrate materials. The thermal mixing method is disclosed, for example, in co-pending and co-assigned U.S. patent application Ser. No. 10/055,138, filed Jan. 23, 2002, entitled "Method to Create High-Quality SiGe-On-Insulator for Strained Si CMOS Applications".

If a thermodynamically stable SiGe layer is grown on a silicon-on-insulator (SOI) substrate and subsequently oxidized at high temperatures (on the order of about 1200° C. or greater), the final SGOI material formed will generally remain fully strained. This is because the only mechanism available to relieve strain at the substrate level is through defects; and since there is not enough strain energy to form defects, no relaxation occurs. If a metastable SiGe layer is grown on an SOI substrate and oxidized at high temperatures, the layer will tend towards a minimum film energy condition with respect to the residual SiGe film strain and the extent of lattice relaxation (by defect generation). In some applications, it is advantageous to form SGOI that remain fully strained, i.e., no relaxation, rather than a relaxed SiGe layer.

In view of the above, it would seem that the fabrication of fully strained SiGe-on-insulators is only possible by using thermodynamically stable SiGe layers. Such a method however places constraints on the total SGOI film thickness for a given Ge concentration.

Despite the current state of the art, applicants are unaware of any ongoing effort to create a "frustrated" SGOI film in which the SiGe layer is metastable, yet very resistant to relaxation.

SUMMARY OF THE INVENTION

The applicants of the present application have determined that when high-quality, metastable SiGe alloys are formed on SOI substrates having an SOI layer of about 500 Å or less, the SiGe layers can remain substantially strained compared to identical SiGe layers formed on thicker SOI substrates and subsequently annealed and/or oxidized at high temperatures. The present invention thus provides a method of 'frustrating' metastable strained SiGe layers by growing them on thin, clean and high-quality SOI substrates.

The present method has applications to, for example, 1) the selective relaxation of SiGe on a given substrate surface or 2) having fully strained SGOI with SiGe thickness greater than the critical value for a given Ge fraction. In case 1) above, one can use a method of implanting ions into the thin Si layer to create dislocations that allow relaxation to occur in regions in which the implantation is performed.

In broad terms, the method of the present invention, which is useful in fabricating high-quality metastable SiGe-on-insulators, comprises the steps of:

forming a Ge-containing layer on a surface of a top Si-containing layer having a thickness of about 500 Å or less and being located on a barrier layer that is resistant to Ge diffusion; and heating said layers at a temperature which permits inter-diffusion of Ge throughout said top Si-containing layer and said Ge-containing layer thereby forming a substantially metastable, SiGe layer that is resistant to relaxation atop said barrier layer.

The metastable, strained single crystal layer SiGe layer formed using the method of the present invention can be a continuous layer that is present atop the entire substrate, or it can be present as a patterned region atop the substrate.

The present invention also provides a SiGe-on-insulator substrate material that is formed using the above-mentioned processing steps. Specifically, the inventive substrate material comprises a Si-containing substrate, an insulating region that is resistant to Ge diffusion present atop the Si-containing substrate, and a substantially metastable SiGe layer which is resistant to relaxation present atop the insulating region.

DETAILED DESCRIPTION OF THE INVENTION

Figure 1A:
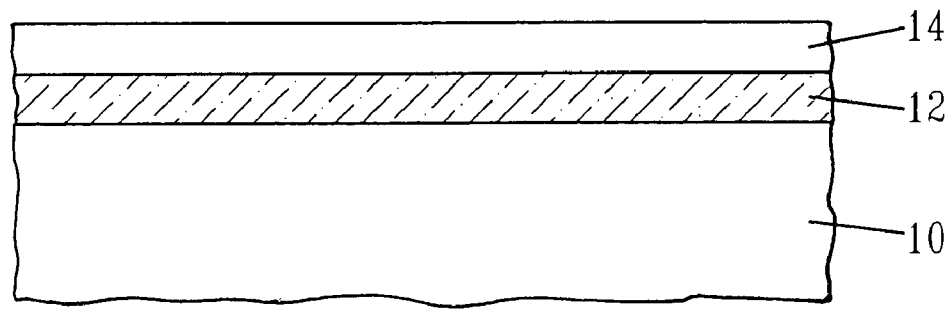
FIGS. 1A–1D are pictorial representations (through cross-sectional views) showing the basic processing steps that are employed in the present invention in fabricating a high-quality, substantially metastable SiGe-on-insulator substrate material wherein the initial substrate includes an unpatterned diffusion barrier region.

The present invention, which provides a method of fabricating high-quality, substantially metastable SiGe-on-insulator substrate materials in which the SiGe layer is resistant to relaxation, will now be described in greater detail by referring to the drawings the accompany the present application. In the drawings, like and/or corresponding elements are referred to by like reference numerals.

Figure 2A:
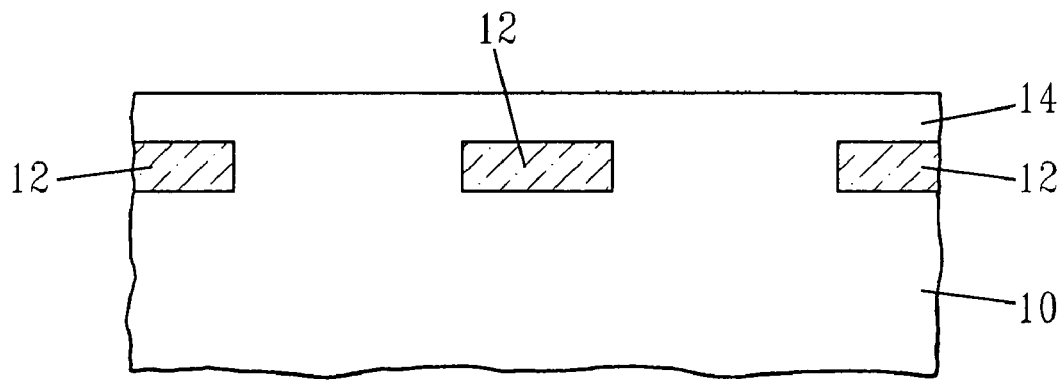
FIGS. 2A–D are pictorial representations (through cross-sectional views) showing the basic processing steps that are employed in an alternative embodiment of the present invention in fabricating a high-quality, substantially metastable SiGe-on-insulator substrate material wherein the initial substrate includes a patterned diffusion barrier region.

Reference is first made to FIG. 1A and FIG. 2A which show initial substrate materials that can be employed in the present invention. Specifically, the initial substrate materials illustrated in FIGS. 1A and 2A each comprise Si-containing semiconductor substrate 10, barrier layer 12 which is resistant to Ge diffusion (hereinafter "barrier layer") present atop a surface of Si-containing semiconductor substrate 10 and a top Si-containing layer 14 present atop the barrier layer 12. The difference between the two initial structures depicted in the drawings is that, in FIG. 1A, the barrier layer 12 is present continuously throughout the entire structure, whereas in FIG. 2A, the barrier layer 12 is present as discrete and isolated regions or islands that are surrounded by semiconductor material, i.e., layers 10 and 14. Note that the initial structure shown in FIG. 1A thus includes an unpatterned barrier layer, whereas the initial structure of FIG. 2A includes a patterned barrier layer.

Notwithstanding whether the barrier layer is patterned or unpatterned, the initial structure may be a conventional silicon-on-insulator (SOI) substrate material wherein region 12 is a buried oxide region which electrically isolates top Si-containing layer 14 from the Si-containing substrate semiconductor substrate 10. The top Si-containing layer 14 can be referred to as the SOI layer. The term "Si-containing" as used herein denotes a single crystal semiconductor material that includes at least silicon. Illustrative examples include, but are not limited to: Si, SiGe, SiC, SiGeC, Si/Si, Si/SiC, Si/SiGeC, and preformed silicon-on-insulators which may include any number of buried oxide (continuous, non-continuous or mixtures of continuous and non-continuous) regions present therein.

The SOI substrate may be formed utilizing conventional SIMOX (separation by ion implantation of oxygen) processes well-known to those skilled in the art, as well as the various SIMOX processes mentioned in co-assigned U.S. patent applications Ser. Nos. 09/861,593, filed May 21, 2001; 09/861,594, filed May 21, 2001; 09/861,590, filed May 21, 2001; 09/861,596, filed May 21, 2001; and 09/884,670, filed Jun. 19, 2001 as well as U.S. Pat. No. 5,930,634 to Sadana, et al., the entire contents of each are being incorporated herein by reference. Note that the process disclosed in the '590 application can be employed herein to fabricate the patterned substrate shown in FIG. 2A. Alternatively, the SOI substrate material may be made using other conventional processes including, for example, a thermal bonding and layer transfer process.

In addition to SOI substrates, the initial substrates shown in FIGS. 1A and 2A may be a non-SOI substrate that is made using conventional deposition processes as well as lithography and etching (employed when fabricating a patterned substrate). Specifically, when non-SOI substrates are employed, the initial structure is formed by depositing a crystalline Ge diffusion barrier layer atop a surface of a Si-containing substrate, via conventional deposition, thermal growing processes or atomic layer deposition (ALD); optionally patterning the barrier layer by employing conventional lithography and etching; and thereafter forming a Si-containing layer atop the barrier layer using conventional deposition processes including chemical vapor deposition (CVD), plasma-assisted CVD, sputtering, evaporation, chemical solution deposition or epitaxial Si growth.

Barrier layer 12 of the initial structure shown in FIGS. 1A and 2A comprises any insulating material that is highly resistant to Ge diffusion. Examples of such insulating and Ge diffusion resistant materials include, but are not limited to: crystalline or non-crystalline oxides or nitrides.

In accordance with the present invention, the top Si-containing layer 14 of the initial structure is a relatively thin layer. The term "relatively thin" is used in the present invention to denote a top Si-containing layer 14 thickness of about 500 Å or less, with a thickness of from about 10 to about 350 Å being more highly preferred. The thin top Si-containing layer 14 can be obtained by cutting, proper choice of implantation conditions, proper choice of deposition conditions, etching, planarization or oxidation-based thinning of thicker SOI layers.

In the case of barrier layer 12 (i.e., Ge diffusion resistant layer), that layer may have a thickness of from about 1 to about 1000 nm, with a thickness of from about 20 to about 200 nm being more highly preferred. The thickness of the Si-containing substrate layer, i.e., layer 10, is inconsequential to the present invention.

Figure 1B:
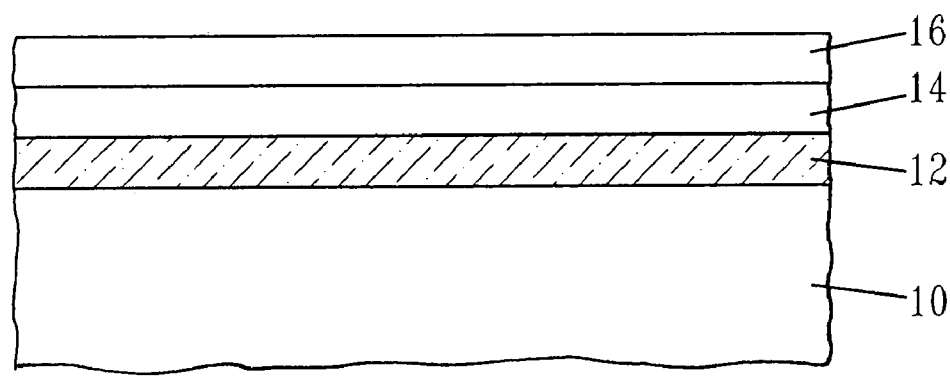
Figure 2B:
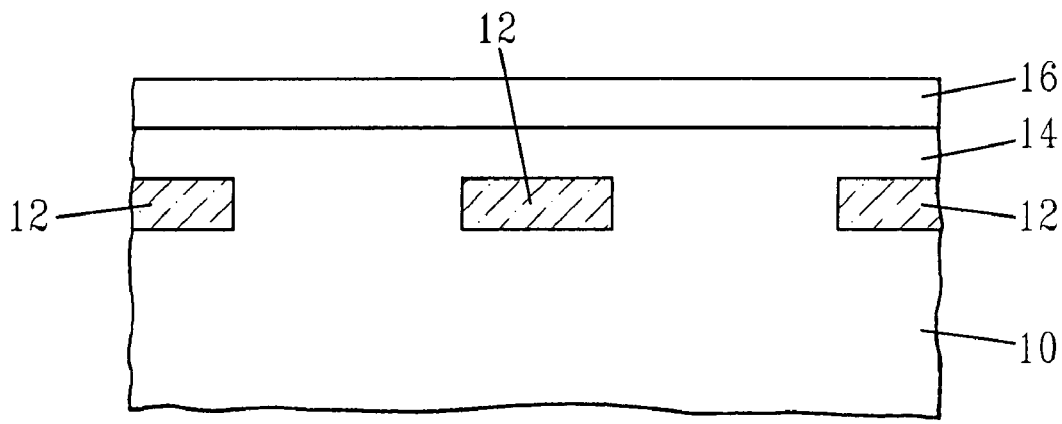

FIGS. 1B and 2B illustrate the structure that is formed after Ge-containing layer 16 is formed atop the top Si-containing layer 14. The Ge-containing layer 16 can be comprised of pure Ge or a SiGe alloy layer. The term "SiGe alloy layer" includes SiGe alloys that comprise up to 99.99 atomic percent Ge, more preferably alloys where the Ge content is from about 0.1 to about 99.9 atomic percent. Even more preferably, the SiGe alloys used in the present invention have a Ge atomic percent of from about 10 to about 35.

In accordance with the present invention, the Ge-containing layer 16 is formed atop first Si-containing layer 14 using any conventional epitaxial growth method that is known to those skilled in the art that is capable of growing a SiGe alloy or pure Ge layer that is metastable and substantially free from defects, i.e., misfit and threading dislocations. Illustrative examples of such epitaxial growing processes that are capable of growing metastable and substantially defect free films include, but are not limited to: low-pressure chemical vapor deposition (LPCVD), ultra-high vacuum chemical vapor deposition (UHVCVD), atmospheric pressure chemical vapor deposition (APCVD), molecular beam (MBE) epitaxy and plasma-enhanced chemical vapor deposition (PECVD).

The thickness of the Ge-containing layer 16 formed at this point of the present invention may vary, but typically layer 16 has a thickness of from about 10 to about 500 nm, with a thickness of from about 20 to about 200 nm being more highly preferred.

Figure 3A:
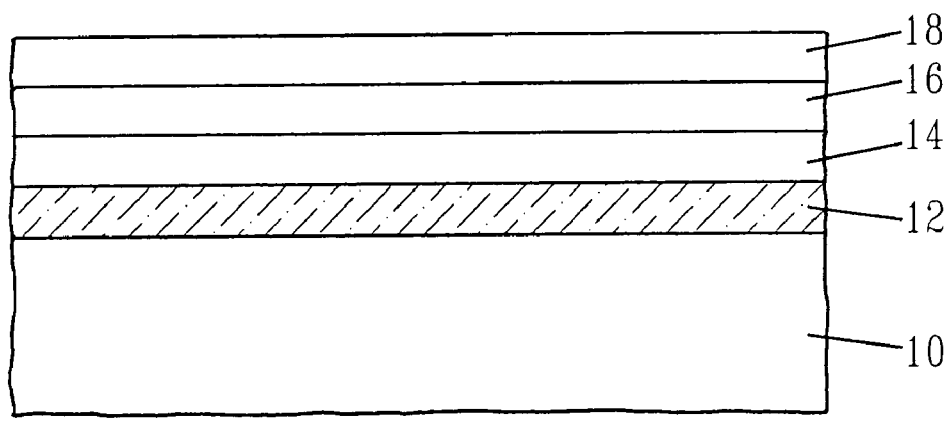
FIGS. 3A–3B are pictorial representations (through cross-sectional views) showing an alternative embodiment of the present invention wherein a Si cap layer is formed atop a Ge-containing layer which is formed on an unpatterned (3A) or patterned (3B) substrate.
Figure 3B:
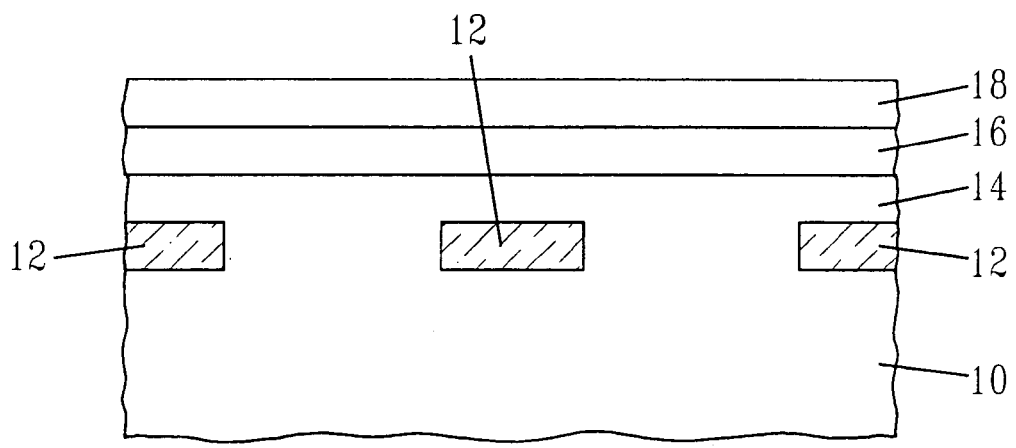

In an alternative embodiment of the present invention, see FIGS. 3A–3B, optional cap layer 18 is formed atop the Ge-containing layer 16 prior to performing the heating step of the present invention. The optional cap layer 18 employed in the present invention comprises any Si material including, but not limited to: epitaxial silicon (epi-Si), amorphous silicon (a:Si), single or polycrystalline Si or any combination thereof including multilayers. In a preferred embodiment, the cap layer is comprised of epi Si. It is noted that layers 16 and 18 may, or may not, be formed in the same reaction chamber.

When present, the optional cap layer 18 has a thickness of from about 1 to about 100 nm, with a thickness of from about 1 to about 30 nm being more highly preferred. The optional cap layer 18 is formed utilizing any known deposition process including the epitaxial growth processes mentioned above.

In one embodiment of the present invention, it is preferred to form a pure Ge or SiGe alloy (15 to 20 atomic percent Ge) layer having a thickness of from about 1 to about 500 nm on the surface of a Si-containing layer, and thereafter forming a Si cap layer having a thickness of from about 1 to about 100 nm atop the Ge-containing layer.

Figure 1C:
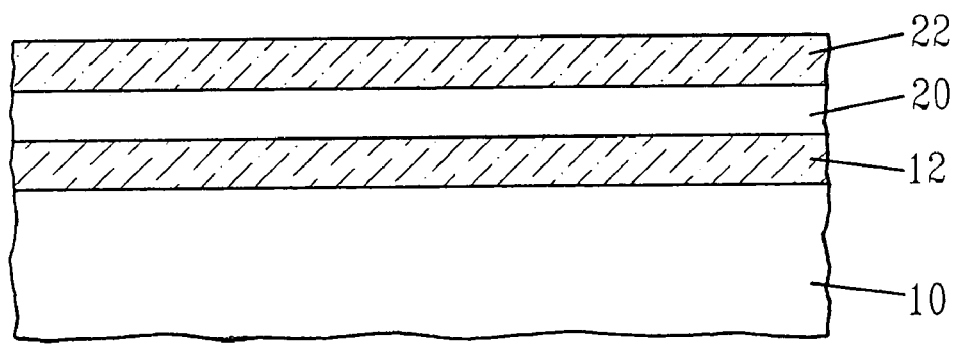
Figure 2C:
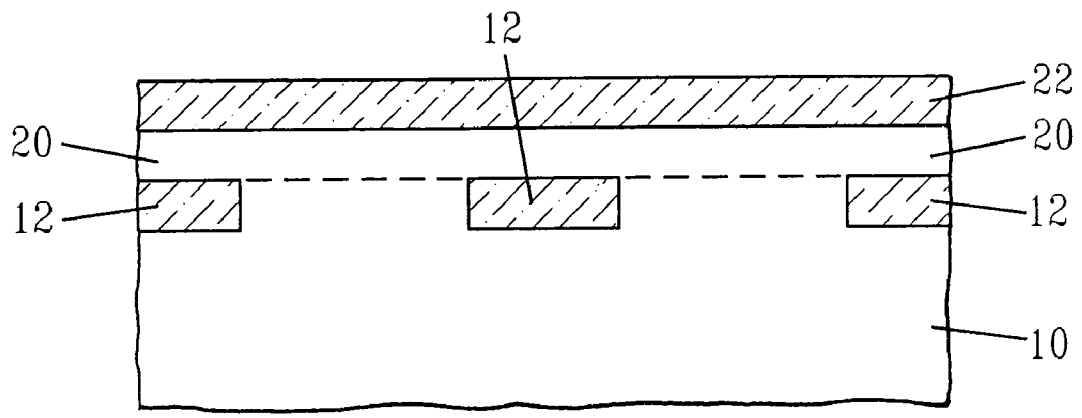

After forming the Ge-containing layer 16 (and optional cap layer 18) atop the initial structure, the structure shown in either FIG. 1B, 2B, 3A or 3B is then heated, i.e., annealed, at a temperature which permits interdiffusion of Ge throughout top Si-containing layer 14, Ge-containing layer 16 and, if present, the optional Si cap 18 thereby forming a substantially metastable, single crystal SiGe layer 20 that is highly resistant to relaxation atop the barrier layer. During the heating step, a surface oxide layer 22 is formed atop the SiGe layer 20. The surface oxide layer 22 is typically, but not always, removed from the structure after the heating step using a conventional wet etch process wherein a chemical etchant such as HF that has a high selectivity for removing oxide as compared to SiGe is employed. FIGS. 1C and 2C show the structure that is formed after the heating steps has been performed.

Note that when the surface oxide layer 24 is removed, a single crystal Si layer can be formed atop layer 20 and the above processing steps of the present invention may be repeated any number of times to produce a multilayered substantially metastable SiGe substrate material.

The surface oxide layer 22 formed after the heating step of the present invention has a variable thickness which may range from about 10 to about 1000 nm, with a thickness of from about 20 to about 500 nm being more highly preferred.

Specifically, the heating step of the present invention is an annealing step that is performed at a temperature of from about 900° to about 1350° C., with a temperature of from about 1200° to about 1335° C. being more highly preferred. Moreover, the heating step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The heating step of the present invention may be carried out for a variable period of time that typically ranges from about 10 to about 1800 minutes, with a time period of from about 60 to about 600 minutes being more highly preferred.

The heating step may be carried out at a single targeted temperature, or various ramp and soak cycles using various ramp rates and soak times can be employed.

The heating step is performed under an oxidizing ambient to achieve the presence of a surface oxide layer 22, which acts as a diffusion barrier to Ge atoms. Therefore, once the oxide layer is formed on the surface of the structure, Ge becomes trapped between barrier layer 12 and surface oxide layer 22. As the surface oxide increases in thickness, the Ge becomes more uniformly distributed throughout layers 14, 16, and optionally 18, but it is continually and efficiently rejected from the encroaching oxide layer. So as the (now homogenized) layers are thinned during this heating step, the relative Ge fraction increases. Efficient thermal mixing is achieved in the present invention when the heating step is carried out at a temperature of from about 1200° to about 1320° C. in a diluted oxygen-containing gas.

It is also contemplated herein to use a tailored heat cycle that is based upon the melting point of the SiGe layer. In such an instance, the temperature is adjusted to tract at or near the melting point of the SiGe layer. This procedure is disclosed, for example, in co-pending and co-assigned U.S. patent application Ser. No. 10/448,948, filed May 30, 2003. The content of the aforementioned U.S. application is incorporated herein by reference.

If the oxidation occurs too rapidly, Ge cannot diff-use away from the surface oxide/SiGe interface fast enough and is either transported through the oxide (and lost) or the interfacial concentration of Ge becomes so high that the alloy melting temperature will be reached.

Figure 5:
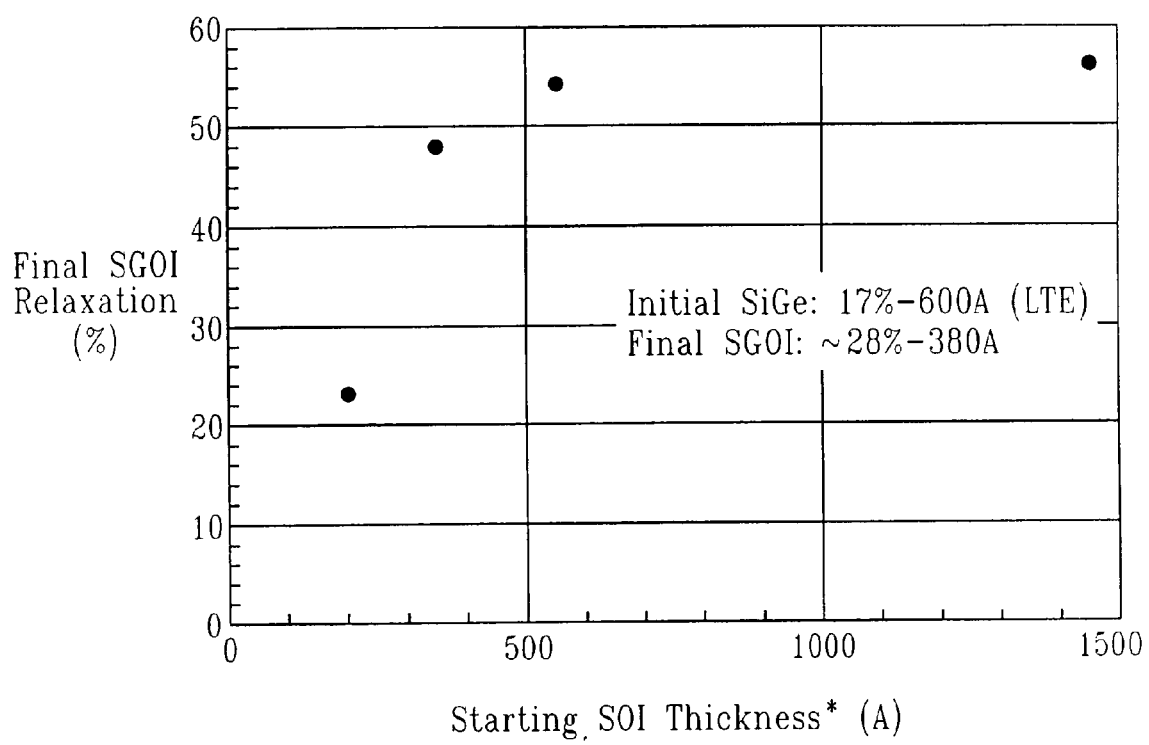
FIG. 5 is a graph plotting final SGOI Relaxation (%) vs. starting SOI thickness (Å).

The role of the heating step of the present invention is to allow Ge atoms to diffuse more quickly thereby maintaining a homogeneous distribution during annealing. After this heating step has been performed, the structure includes a uniform and substantially metastable SiGe alloy layer 20, sandwiched between barrier layer 12 and surface oxide layer 22. Because the initial Si-containing layer was thin, the thus formed SiGe alloy layer is frustrated since it is not permitted to relax because the usual mechanisms responsible for nucleation and growth of strain-relieving dislocations have, in some way, changed. The measured relaxation of the substantially metastable SiGe layer is between 0 to 85% of the relaxation value measured on similar SiGe layers formed using thicker starting SOI layers (greater than 500 Å). More typically, the measured value of relaxation is between 5 to 50% of the value that is measured on equivalent SiGe layers formed using thicker starting SOI layers; the resistance to relaxation is a function of the SOI thickness as shown in FIG. 5.

In accordance with the present invention, the SiGe layer 20 has a thickness of about 2000 nm or less, with a thickness of from about 10 to about 100 nm being more highly preferred. Note that the SiGe layer 20 formed in the present invention is thin.

The SiGe layer 20 formed in the present invention has a final Ge content of from about 0.1 to about 99.9 atomic percent, with an atomic percent of Ge of from about 10 to about 35 being more highly preferred. Another characteristic feature of SiGe layer 20 is that it is a strained layer.

Figure 1D:
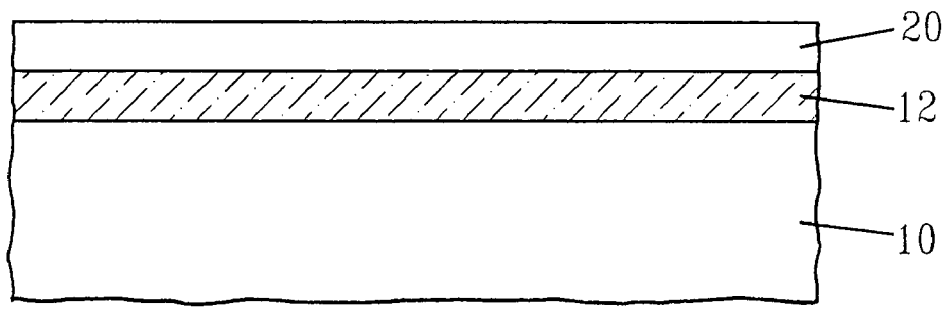
Figure 2D:
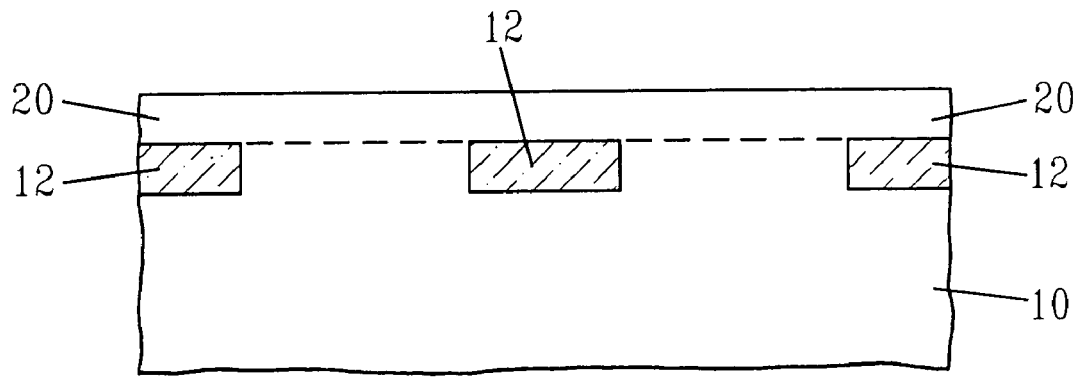

As stated above, the surface oxide layer 22 may be stripped at this point of the present invention so as to provide the SiGe-on-insulator substrate material shown, for example, in FIG. 1D or 2D (note that the substrate material does not include the cap layer since that layer has been used in forming the SiGe layer).

Figure 4A:
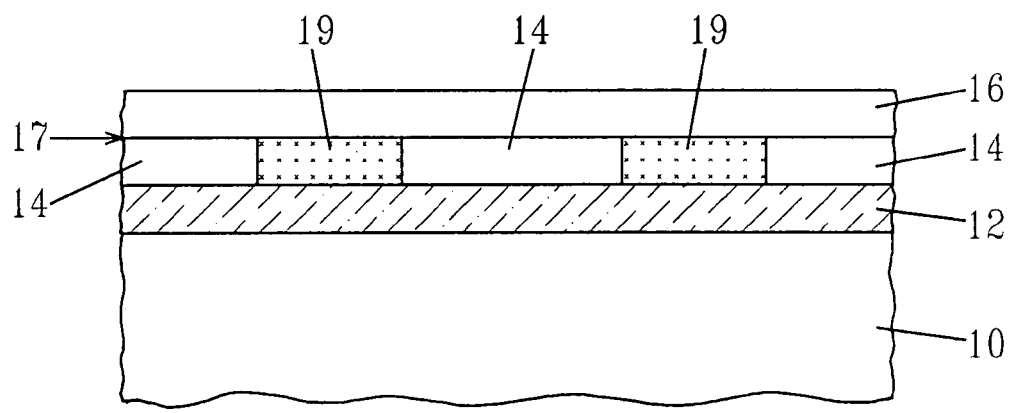
FIGS. 4A–4B are pictorial representations (through cross-sectional views) showing an alternative embodiment of the present invention in which selective ion implantation is performed to form regions of metastable and strained SiGe and relaxed SiGe atop a barrier layer that is resistant to Ge diffusion.
Figure 4B:
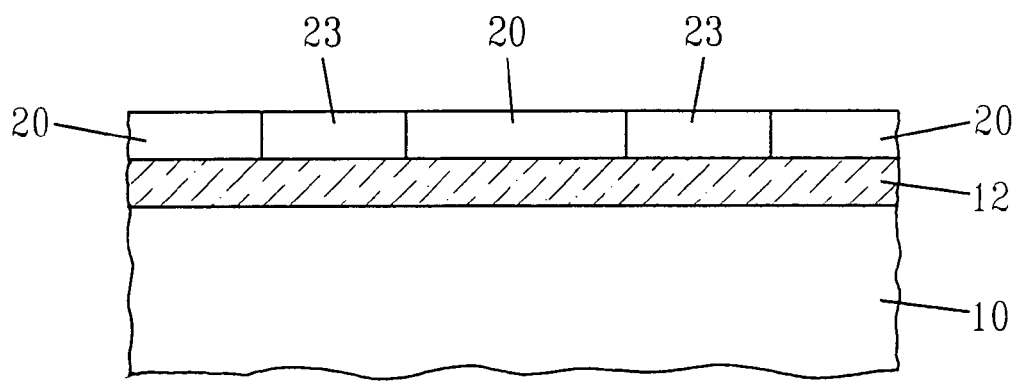

In some embodiments of the present invention, it is possible to form a substrate material wherein portions of the SiGe layer are substantially relaxed and other portions of the SiGe layer are substantially metastable and strained. Such an embodiment is depicted in FIGS. 4A–4B. In this embodiment, ions are implanted into predetermined portions of the top Si-containing layer 14 prior to annealing. Specifically after forming the Ge-containing layer 16 (with or without the optional cap layer 18) atop the initial structure, the structure is then subjected to an ion implantation step wherein ions that are capable of forming or nucleating strain-relieving defects within the top Si-containing layer 14 or near the interface between the top Si-containing layer 14 and the Ge-containing layer 16 is performed. Almost any ions can be used to form or nucleate strain-relieving defects because dislocations can nucleate from a wide range of crystalline imperfections such as vacancy clusters, point defects, platelet defects and bubble or void defects. The implant may be performed with an implantation mask that is located on the surface of the structure or some distance from the structure.

The structure after this implantation step is shown in FIG. 4A (without optional cap layer). In this figure, reference numeral 19 denotes the defect regions formed by the ion implantation step and reference numeral 17 denotes the interface between the top Si-containing layer 14 and the Ge-containing layer 16. The defect regions solve the problem of defect production in the Ge-containing layer/Si-containing layer bilayer by allowing formation or nucleation and growth of strain-relieving defects in said regions.

Implantation conditions for a particular ion are chosen to place the ion peak concentration within or near the Si-containing layer 14. Highly preferred ions are those that are compatable with modern CMOS manufacturing: H, B, C, N, O, Si, P, Ge, As or any of the inert gas ions. Example ions used in the present invention are hydrogen ions ($H^+$). It is noted that other species of hydrogen such as $H_2^+$ are also contemplated herein.

The implant step of the present invention is conducted at approximately room temperature, i.e., a temperature of from about 283K to about 303K, using a beam current density of from about 0.01 to about 10 microamps/$cm^2$. Implantation at different temperatures and/or using other beam current densities may affect defect formation.

The concentration of the implant species used in forming the platelet defects may vary depending upon the type of implant species employed. Typically, however, the concentration of implanted ions (H) used at this point of the present invention is below $3E16$ $cm^{-2}$, with an ion concentration of from about $1E16$ to about $2.99E16$ $cm^{-2}$ being more highly preferred. The energy of this implant may also vary depending upon the type of ion that is being implanted, with the proviso that the implant energy must be capable of positioning ions within layer 14 or near the interface between layers 14 and 16. For example, when hydrogen is employed as the implant ion, the energy used to ensure defect formation within layer 14 or near the interface between layers 14 and 16 is from about 1 to about 100 keV, with an energy of from about 3 to about 20 keV being more highly preferred.

After the implant step, and if not previously formed on the structure, the optional cap may be formed atop the Ge-containing alloy layer. Next, the implanted structure is heated, i.e., annealed, using the conditions described above. FIG. 4B illustrates the structure that is formed after the annealing step. In this drawing, the surface oxide layer has been removed. The substantially metastable and strained SiGe portions are labeled as 20, while substantially relaxed SiGe portions that received the above described ion implant are labeled as 23. The measured relaxation of the substantially relaxed SiGe region 23 is between 90 to 110% of the relaxation value measured on SiGe layers with equivalent film thickness and Ge concentration formed using thicker starting SOI layer 14 (greater than 500 Å) without ion implantation. The possibility of relaxed SiGe region 23 having greater than 100% of the relaxation value of equivalent SiGe layers is due to the fact that ion-implanted strained layers tend to relax more efficiently because of the random nature of the defect nucleation.

A Si layer can be formed atop the SiGe layer (relaxed and/or metastable) using a conventional epitaxial deposition process well-known in the art. The thickness of the epi-Si layer may vary, but typically, the epi-Si layer has a thickness of from about 1 to about 100 nm, with a thickness of from about 1 to about 50 nm being more highly preferred.

In some instances, additional SiGe can be formed atop SiGe layer (relaxed and/or metastable) utilizing the above-mentioned processing steps, and thereafter an epi-Si layer may be formed. Because the relaxed SiGe layer has a large in-plane lattice parameter as compared to the epi-Si layer, the epi-layer will be strained in a tensile manner.

As stated above, the present invention also contemplates superlattice structures as well as lattice mismatched structures which include at least the SiGe-on-insulator substrate material of the present invention. In the case of superlattice structures, such structures would include at least the SiGe-on-insulator substrate material of the present invention, and alternating layers Si and SiGe formed atop the SiGe layer of the substrate material.

In the case of lattice mismatched structures, GaAs, GaP or other like compound would be formed atop the SiGe layer of the inventive SiGe-on-insulator substrate material.

The following example is provided to illustrate the method of the present ion as well as some advantages that may be obtained therefrom.

EXAMPLE

In this example, the final SGOI relaxation for samples having various SOI starting thickness were determined. Specifically, the measured relaxation of SGOI layers made by growing 600 Å-17% SiGe on SOI substrates with a top SOI layer having a thickness ranging from 1450 Å down to 200 Å was determined. All of the structures were then converted into approximately 380 Å-28% SiGe SGOI using the method described above. Specifically, the initial SiGe/Si bilayer is oxidized at a high temperature of about 1200° C. allowing Ge to diffuse uniformly throughout the layers while being rejected from the growing surface oxide layer. This way, the total Ge content is retained as the (homogenized) SGOI layer is thinned by the oxidation process. The SOI thickness reported in FIG. 5 does not take into account the thin Si buffer layer that is grown before the SiGe layer is grown which is part of the low-temperature epitaxial process. FIG. 5 clearly shows a rapid decrease in the measured relaxation (using X-ray diffraction) of the final SGOI with decreasing initial top SOI layer thickness. It is the region in FIG. 5 below 500 Å starting SOI thickness that the inventive highly metastable and relaxation-resistant silicon-germanium-on-insulator is realized.

While the present invention has been particularly shown and described with respect to preferred embodiments thereof, it will be understood by those skilled in the art that the foregoing and other changes in forms and details may be made without departing from the scope and spirit of the present invention. It is therefore intended that the present

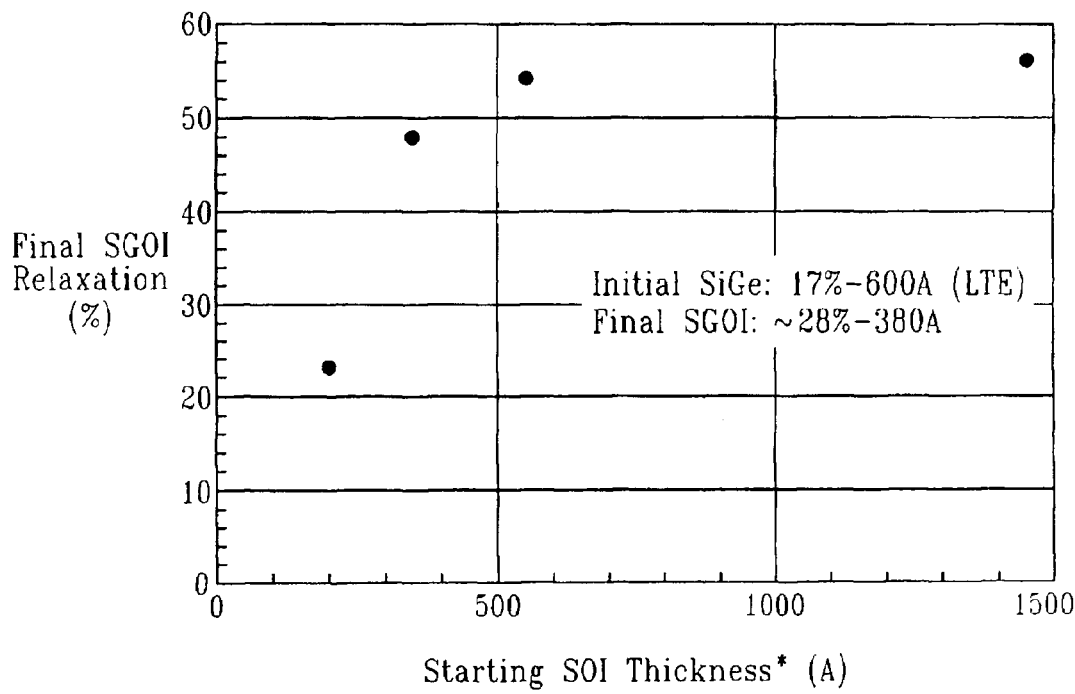

What is claimed is:

1. A method of producing a high-quality, substantially metastable SiGe-on-insulator substrate material comprising the steps of:
   forming a Ge-containing layer on a surface of a top Si-containing layer having a thickness of about 500 Å or less and being located on a barrier layer that is resistant to Ge diffusion; and
   heating said layers at a temperature which permits interdiffusion of Ge throughout said top Si-containing layer and said Ge-containing layer thereby forming a substantially metastable, SiGe layer atop that is resistant to relaxation on said barrier layer.

2. The method of claim 1 wherein said top Si-containing layer and said barrier layer are components of a silicon-on-insulator (SOI) substrate.

3. The method of claim 1 wherein said top Si-containing layer is a single crystal layer.

4. The method of claim 1 wherein said top Si-containing layer has a thickness of from about 10 to about 350 Å.

5. The method of claim 1 wherein said barrier layer is a patterned barrier layer.

6. The method of claim 1 wherein said barrier layer is an unpatterned barrier layer.

7. The method of claim 1 wherein said barrier layer comprises crystalline or non-crystalline oxides, or crystalline or non-crystalline nitrides.

8. The method of claim 1 wherein said barrier layer is a buried oxide region that is patterned or unpatterned.

9. The method of claim 1 wherein the Ge-containing layer comprises pure Ge or a SiGe alloy comprising up to 99.99 atomic percent Ge.

10. The method of claim 9 wherein said Ge-containing layer is a SiGe alloy layer comprising from about 10 to about 35 atomic percent Ge.

11. The method of claim 1 wherein said Ge-containing layer is formed by an epitaxial growth process selected from the group consisting of low-pressure chemical vapor deposition, atmospheric pressure chemical vapor deposition, ultra-high vacuum chemical vapor deposition, molecular beam epitaxy, and plasma-enhanced chemical vapor deposition.

12. The method of claim 1 further comprising forming a Si cap layer atop said Ge-containing layer prior to performing the heating step.

13. The method of claim 12 wherein said Si cap layer comprises epi-Si, a:Si, single or polycrystalline Si or any combination and multilayer thereof.

14. The method of claim 1 wherein a surface oxide layer forms during said heating step.

15. The method of claim 1 wherein said heating step is carried out in an oxidizing ambient which comprises at least one oxygen-containing gas.

16. The method of claim 15 wherein said at least one oxygen-containing gas comprises $O_2$, NO, $N_2O$, ozone, air or mixtures thereof.

17. The method of claim 15 further comprising an inert gas, said inert gas being employed to dilute said at least one oxygen-containing gas.

18. The method of claim 15 wherein said heating step is performed at a temperature of from about 900° to about 1350° C.

19. The method of claim 18 wherein said heating step is performed at a temperature of from about 1200° to about 1335° C.

20. The method of claim 1 further comprising performing a selective ion implantation step after formation of the Ge-containing layer and prior to heating such that said heating step forms a patterned SiGe-on-insulator substrate material in which portions of the SiGe layer are substantially metastable and strained and other portions of the SiGe layer are substantially relaxed.

21. The method of claim 20 wherein the selective ion implantation step includes implanting ions selected from the group consisting of hydrogen, boron, carbon, nitrogen, oxygen, silicon, phosphorous, germanium, arsenic, any of the inert gas ions, and mixtures thereof.

22. The method of claim 21 wherein said implanted ions are hydrogen ions.

23. The method of claim 20 wherein said selective ion implantation step is performed using an ion concentration of below 3E16 atoms/cm$^2$.

24. The method of claim 20 wherein hydrogen ions are implanted during said selective ion implantation step at an energy of from about 1 to about 100 keV.

25. A substrate material comprising:
   a Si-containing substrate;
   an insulating region that is resistant to Ge diffusion present atop the Si-containing substrate; and
   a substantially metastable SiGe layer which is resistant to relaxation present atop the insulating region.

26. The substrate material of claim 25 wherein said insulating region is patterned.

27. The substrate material of claim 25 wherein said insulating region is unpatterned.

28. The substrate material of claim 25 wherein said insulating region comprises crystalline or non-crystalline oxides, or crystalline or non-crystalline nitrides.

29. The substrate material of claim 25 wherein said insulating region is a buried oxide region that is patterned or unpatterned.

30. A substrate material comprising:
   a Si-containing substrate;
   an insulating region that is resistant to Ge diffusion present atop the Si-containing substrate; and
   a substantially metastable SiGe region which is resistant to relaxation present atop the insulating region; and
   a relaxed SiGe region abutting the substantially metastable SiGe region.

* * * * *

UNITED STATES PATENT AND TRADEMARK OFFICE
CERTIFICATE OF CORRECTION

| | | |
|---|---|---|
| PATENT NO. | : 6,989,058 B2 | Page 1 of 1 |
| APPLICATION NO. | : 10/654232 | |
| DATED | : January 24, 2006 | |
| INVENTOR(S) | : Stephen W. Bedell et al. | |

It is certified that error appears in the above-identified patent and that said Letters Patent is hereby corrected as shown below:

On the title page:
[56] References cited (U.S. Patent Documents)
"6,841,457 B2 1/2005 Bendell, et al."

should read

[56] References cited (U.S. Patent Documents)
--6,841,457 B2 1/2005 Bedell, et al.--

Column 2, Line 39-40:
"permits inter-difflusion of Ge" should read --permits interdiffusion of Ge--

Column 6, line 26:
"cannot diff-use away" should read --cannot diffuse away--

Column 8, Line 35:
"of the present ion" should read --of the present application--

Signed and Sealed this

Seventeenth Day of October, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,989,058 B2 |
| APPLICATION NO. | : 10/654232 |
| DATED | : January 24, 2006 |
| INVENTOR(S) | : Stephen W. Bedell et al. |

It is certified that error appears in the above-identified patent and that said Letters Patent is hereby corrected as shown below:

Column 10, Claims 25–30 should be cancelled

Signed and Sealed this
Eleventh Day of September, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 6,989,058 B2 | Page 1 of 2 |
| APPLICATION NO. | : 10/654232 | |
| DATED | : January 24, 2006 | |
| INVENTOR(S) | : Stephen W. Bedell et al. | |

It is certified that error appears in the above-identified patent and that said Letters Patent is hereby corrected as shown below:

Delete the title page and substitute therefore the attached title page showing the corrected number of claims in patent.

Column 10, lines 31-57, Claims 25–30 should be cancelled

This certificate supersedes the Certificate of Correction issued September 11, 2012.

Signed and Sealed this
Ninth Day of October, 2012

David J. Kappos
*Director of the United States Patent and Trademark Office*

# United States Patent
Bedell et al.

(10) Patent No.: US 6,989,058 B2
(45) Date of Patent: Jan. 24, 2006

(54) USE OF THIN SOI TO INHIBIT RELAXATION OF SIGE LAYERS

(75) Inventors: Stephen W. Bedell, Wappingers Falls, NY (US); Huajie Chen, Wappingers Falls, NY (US); Keith E. Fogel, Mohegan Lake, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 10/654,232

(22) Filed: Sep. 3, 2003

(65) Prior Publication Data

US 2005/0048778 A1 Mar. 3, 2005

(51) Int. Cl.
*C30B 25/02* (2006.01)
(52) U.S. Cl. .............................. 117/4; 117/89; 438/689
(58) Field of Classification Search .................... 117/4, 117/89; 438/689
See application file for complete search history.

(56) References Cited

U.S. PATENT DOCUMENTS 6,841,457 B2 * 1/2005 Bendell et al. ............. 438/479
6,861,158 B2 * 3/2005 Bedell et al. ............... 428/641

* cited by examiner

*Primary Examiner*—Felisa Hiteshew

(74) *Attorney, Agent, or Firm*—Scully, Scott, Murphy & Presser; Robert M. Trepp, Esq.

(57) ABSTRACT

High-quality, metastable SiGe alloys are formed on SOI substrates having an SOI layer of about 500 Å or less, the SiGe layers can remain substantially fully strained compared to identical SiGe layers formed on thicker SOI substrates and subsequently annealed and/or oxidized at high temperatures. The present invention thus provides a method of 'frustrating' metastable strained SiGe layers by growing them on thin, clean and high-quality SOI substrates.

24 Claims, 5 Drawing Sheets